US011538824B2

(12) United States Patent
Xue et al.

(10) Patent No.: US 11,538,824 B2
(45) Date of Patent: Dec. 27, 2022

(54) THREE-DIMENSIONAL MEMORY DEVICES WITH IMPROVED CHARGE CONFINEMENT AND FABRICATION METHODS THEREOF

(71) Applicant: YANGTZE MEMORY TECHNOLOGIES CO., LTD., Wuhan (CN)

(72) Inventors: Lei Xue, Wuhan (CN); Lan Yao, Wuhan (CN); Chia-Chann Shiue, Wuhan (CN); Xiaoxin Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 40 days.

(21) Appl. No.: 16/860,829

(22) Filed: Apr. 28, 2020

(65) Prior Publication Data

US 2021/0257380 A1    Aug. 19, 2021

Related U.S. Application Data

(63) Continuation of application No. PCT/CN2020/075498, filed on Feb. 17, 2020.

(51) Int. Cl.
*H01L 27/11582*   (2017.01)
*H01L 27/1157*    (2017.01)

(52) U.S. Cl.
CPC .... *H01L 27/11582* (2013.01); *H01L 27/1157* (2013.01)

(58) Field of Classification Search
CPC ..................................... H01L 27/115–11597
See application file for complete search history.

(56) References Cited

U.S. PATENT DOCUMENTS 8,969,947 B2    3/2015  Lee et al.
2013/0093005 A1*  4/2013  Yun ..................... H01L 27/1157
                                            257/329

(Continued)

FOREIGN PATENT DOCUMENTS

CN    109643716 A    4/2019
CN    109768047 A    5/2019
TW    201843775 A    12/2018

*Primary Examiner* — Allen L Parker
*Assistant Examiner* — Gustavo G Ramallo
(74) *Attorney, Agent, or Firm* — Bayes PLLC

(57) ABSTRACT

Embodiments of a three-dimensional (3D) memory device and method for forming the 3D memory device are provided. In an example, the 3D memory device includes a plurality of conductor layers extending over a substrate, a channel structure vertically extending through the conductor layers to the substrate, and a source structure extending through the conductor layers to the substrate. The channel structure may include a blocking layer having a plurality of blocking portions disconnected from one another. Each of the blocking portions may include (i) a vertical blocking portion under a respective conductor layer, and (ii) at least one lateral blocking portion covering a respective lateral surface of the respective conductor layer. The channel structure may also include a memory layer having a plurality of memory portions disconnected from one another, each of the memory portions under and in contact with the respective vertical blocking portion.

20 Claims, 10 Drawing Sheets

(56) References Cited

U.S. PATENT DOCUMENTS

| | | | |
|---|---|---|---|
| 2013/0119455 A1* | 5/2013 | Chen | H01L 27/11578 257/324 |
| 2016/0086972 A1* | 3/2016 | Zhang | H01L 27/1157 257/66 |
| 2018/0151588 A1 | 5/2018 | Tsutsumi et al. | |
| 2019/0035805 A1 | 1/2019 | Lee et al. | |
| 2020/0127002 A1* | 4/2020 | Park | H01L 27/11556 |

* cited by examiner

THREE-DIMENSIONAL MEMORY DEVICES WITH IMPROVED CHARGE CONFINEMENT AND FABRICATION METHODS THEREOF

CROSS-REFERENCE TO RELATED APPLICATIONS

This application is continuation of International Application No. PCT/CN2020/075498, filed on Feb. 17, 2020, entitled "THREE-DIMENSIONAL MEMORY DEVICES AND FABRICATION METHODS THEREOF," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and the fabrication methods to form the 3D memory devices are disclosed herein.

In one example, a 3D memory device may include a plurality of conductor layers extending over a substrate, a channel structure vertically extending through the conductor layers to the substrate, and a source structure extending through the conductor layers to the substrate. The channel structure may include a blocking layer having a plurality of blocking portions disconnected from one another. Each of the blocking portions may include (i) a vertical blocking portion under a respective conductor layer, and (ii) at least one lateral blocking portion covering a respective lateral surface of the respective conductor layer. The channel structure may also include a memory layer having a plurality of memory portions disconnected from one another, each of the memory portions under and in contact with the respective vertical blocking portion.

In another example, a method for forming a 3D memory device may include the following operations. First, an initial channel structure may be formed in a stack structure that has interleaved a plurality of first layers and a plurality of second layers over a substrate, the initial channel structure being without a blocking layer. An initial slit opening may be formed in the stack structure. Remaining portions of the second layers may be removed to form a plurality of gate structures each surrounded by a blocking portion of a blocking layer. Remaining portions of the first layers and portions of the initial channel structure may be removed to form a sealing structure in contact with each of the gate structures and exposed portions of the initial channel structure. Further, a source structure may be formed in the sealing structure between adjacent gate structures.

In still another example, a method for forming a 3D memory device may include the following operations. First, an initial channel structure is formed in a stack structure that includes interleaved a plurality of first layers and a plurality of second layers over a substrate. An initial slit opening may be formed in the stack structure and remaining portions of the second layers may be removed to expose an initial memory layer of the initial channel structure. An initial blocking layer may be formed to cover remaining portions of the first layers and the exposed portions of the initial memory layer. A plurality of conductor layers may then be formed in a plurality of lateral recesses surrounded by the initial blocking layer. Portions of the initial memory layer may be removed to form a memory layer having a plurality of memory portions disconnected from one another and portions of the initial blocking layer to form a plurality of blocking portions disconnected from one another. Further, a source structure may be formed between adjacent conductor layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
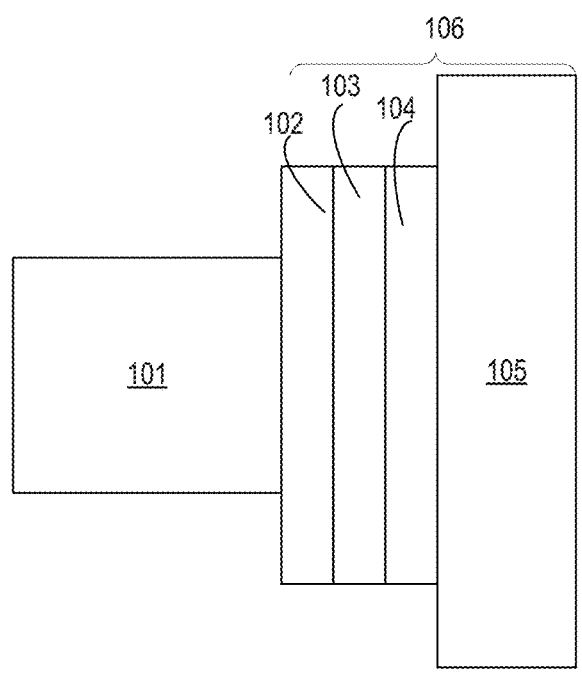
FIG. 1 illustrates a cross-sectional view of a portion of a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the terms "staircase," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "staircase" refers to a vertical shift in the height of a set of adjoined surfaces.

As used herein, the x axis and the y axis (perpendicular to the x-z plane) extend horizontally and form a horizontal plane. The horizontal plane is substantially parallel to the top surface of the substrate. As used herein, the z axis extends vertically, i.e., along a direction perpendicular to the horizontal plane. The terms of "the x axis" and "the y axis" can be interchangeably used with "a horizontal direction," the term of "the x-y plane" can be interchangeably used with "the horizontal plane," and the term of "the z axis" can be interchangeably used with "the vertical direction."

In some 3D memory devices, a semiconductor channel is formed with a channel-forming structure, which includes a blocking layer, a memory layer, a tunneling layer, a semiconductor channel layer, and a dielectric core. Often, the blocking layer, the memory layer, the tunneling layer, and the semiconductor channel layer are sequentially arranged between a gate electrode and the dielectric core. The blocking layer can reduce leakage of electrical charges. The memory layer can trap electric charges, which can tunnel into the semiconductor channel layer and can be transported in the semiconductor layer.

However, as more gate electrodes are stacked over the substrate (e.g., along a semiconductor channel) for higher memory capacity, charge loss becomes more prominent. For example, the memory layer can be more susceptible to charge loss as the number of gate electrodes increases. The charges trapped in the memory layer can be more likely to spread in the memory layer (e.g., along its extending direction). As a result, data retention in the memory layer can be impaired, and operations (e.g., read, write, and/or hold) on the memory cells may have reduced precision.

It is understood that 3D memory device 100 can include additional components and structures not shown in FIG. 1 including, but not limited to, other local contacts and interconnects in one or more BEOL interconnect layers.

FIG. 1 illustrates a cross-section view of a portion of a 3D memory device 100. As shown in FIG. 1, a conductor layer 101 (e.g., a gate electrode) forms contact with a semiconductor channel. For viewing simplicity, a portion of the semiconductor channel is depicted, shown as element 106. Semiconductor channel 106 has a blocking layer 102, a memory layer 103, a tunneling layer 104, and a p-channel 105, stacked sequentially along a direction (e.g., the x axis or the horizontal direction) substantially perpendicular to the direction in which p-channel 105 (e.g., or semiconductor channel 106) extends (e.g., the z axis or the vertical direction). P-channel 105 can include a semiconductor channel layer and a dielectric core, where the semiconductor channel layer is positioned between tunneling layer 104 and the dielectric core.

Conductor layer 101 can include any suitable conductive material such as tungsten (W). Each one of blocking layer 102, memory layer 103, and tunneling layer 104 can include a single-layered structure or a multiple-layered structure. For example, blocking layer 102 can include a silicon oxide (SiO) layer for reducing leakage of charges. Memory layer 103 can include a SiN layer for trapping charges. Tunneling layer 104 can include a SiO layer for facilitating the tunneling of charges from memory layer 103 to p-channel 105. The semiconductor channel layer can include a semiconductor layer such as poly-silicon for facilitating charge transport. The dielectric core can include a dielectric material such as silicon oxide to insulate each memory cell from one another.

As shown in FIG. 1, as the number of conductor layers 101 increases along the vertical direction, charges trapped in memory layer 103 are more likely to spread along the vertical direction, as indicated by the arrow. Especially, charges are more likely to spread in the SiN layer, impairing the data retention of the 3D memory device. The impaired data retention can reduce the precision of operations (e.g., read, write, and/or hold) of the 3D memory device.

Various embodiments in accordance with the present disclosure provide the structures and fabrication method of a 3D memory device, which resolve the above-noted issues associated with charge loss. For example, by changing the structures of the memory layer, charge spreading in the memory layer along its extending direction can be suppressed, improving charge confinement in the memory layer. Accordingly, data retention of the 3D memory device can be improved. In some embodiments, the memory layer can have a plurality of memory portions aligned with its extending direction and disconnected from one another. This configuration can suppress the charges trapped in the memory cell to spread in the memory cell along its extending direction, increasing the data retention in the 3D memory device. A sealing structure that insulates adjacent gate structures (e.g., conductor layers) can be formed to enclose or surround each gate structure. The sealing layer can be in contact with the tunneling layer of the channel structure, separating the memory portions. In some embodiments, the sealing structure includes an air gap between adjacent gate structures, reducing the gate-to-gate coupling capacitance and facilitating device scaling along the vertical direction (z-pitch scaling).

The 3D memory device can be formed from a dielectric stack of interleaved a plurality of first layers and second layers, both employed as sacrificial layers. The thicknesses of first layers, e.g., used to form the sealing structure, can be reduced compared to related art to reduce the stress in the dielectric stack caused by the first layers, facilitate z-pitch scaling, and make it easier to form the air gap between the adjacent gate structures. To improve the etching control and etching uniformity in the process to form the memory portions, in some embodiments, a blocking layer is formed outside of a channel hole in which other channel-forming layers (e.g., memory layer, tunneling layer, semiconductor layer, and dielectric core) are formed. The blocking layer, formed by the deposition and etching of an initial blocking layer, partially surrounds the respective conductor layer vertically and laterally, exposing an initial memory layer to be etched to form the memory layer. Etching of the initial memory layer can be better controlled, and the memory portions can have improved uniformity. In some embodiments, a suitable dielectric material is chosen as the material of the blocking layer so that the etching of the initial memory layer can have little or no damage on the blocking layer. For example, the blocking layer includes silicon oxynitride (SiON) and is formed at least partially from the oxidation of the initial memory layer, which can include silicon nitride.

Figure 2A:
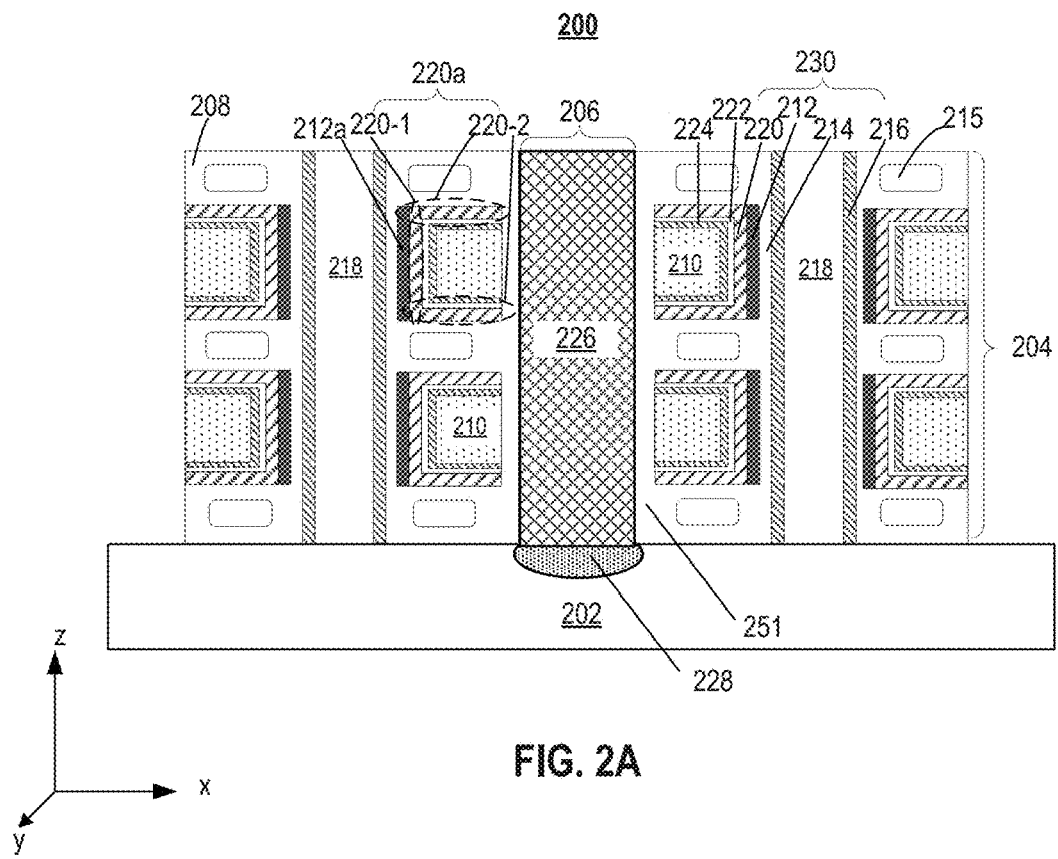
FIGS. 2A and 2B each illustrates an exemplary 3D memory device, according to some embodiments of the present disclosure.
Figure 2B:
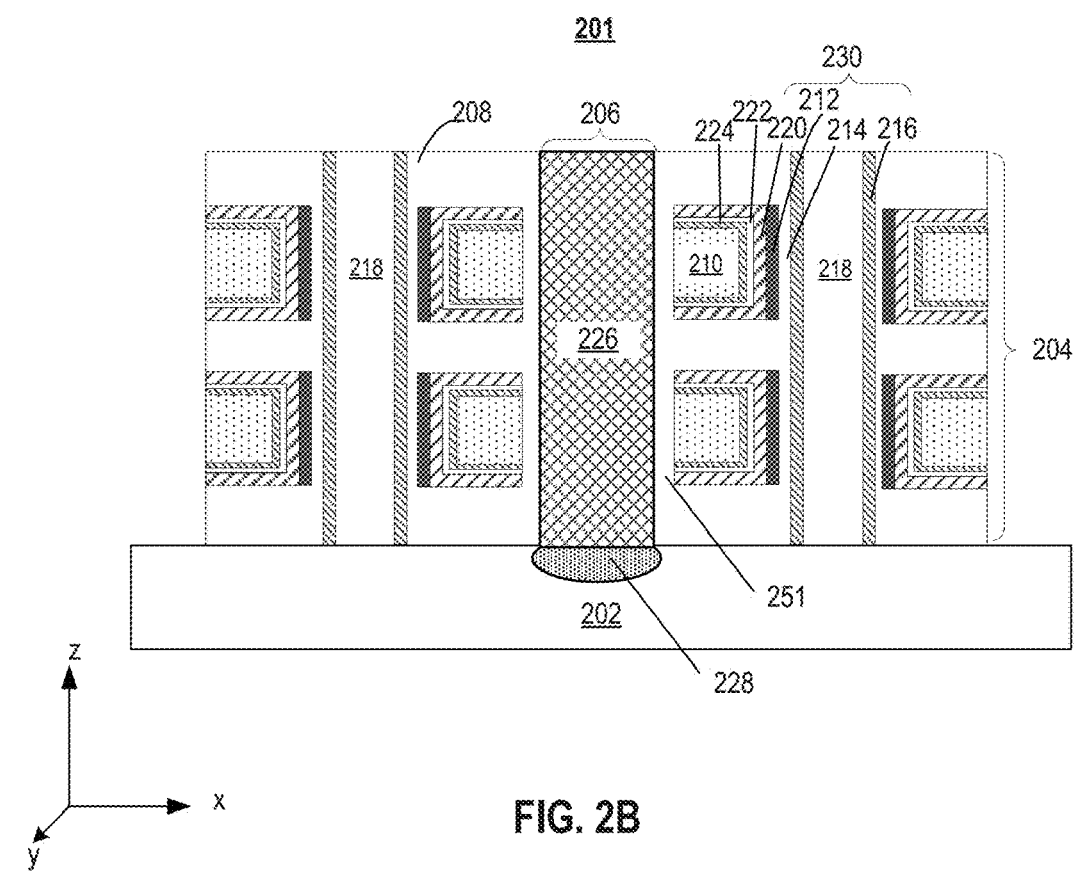
Figure 3A:
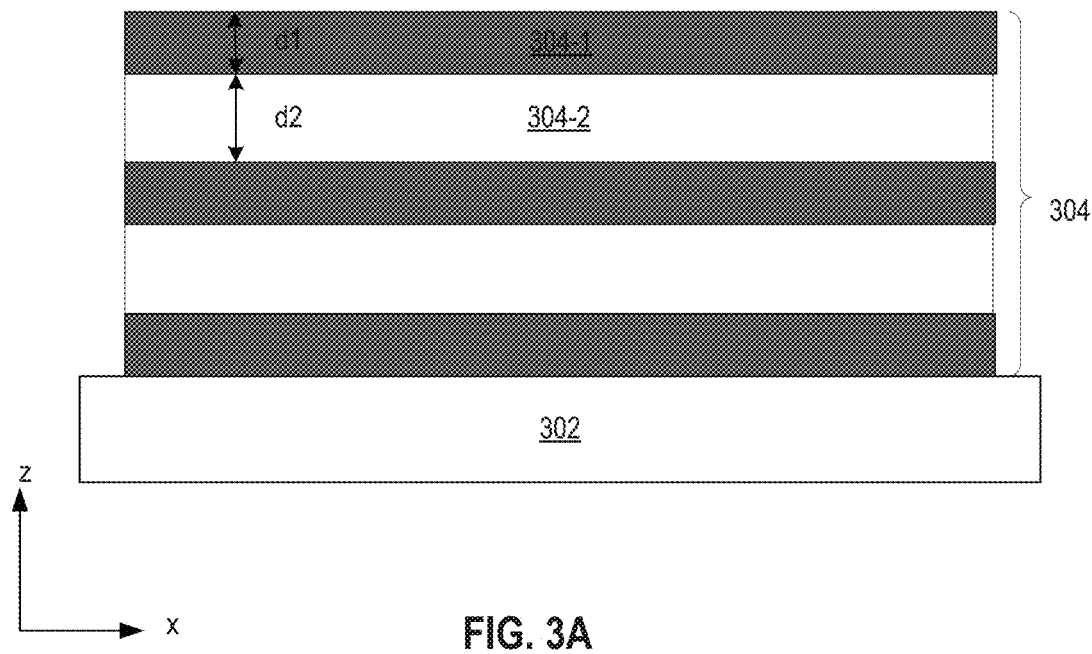
FIGS. 3A-3K illustrate structures of a 3D memory device at various stages of an exemplary fabrication process, according to some embodiments of the present disclosure.
Figure 3B:
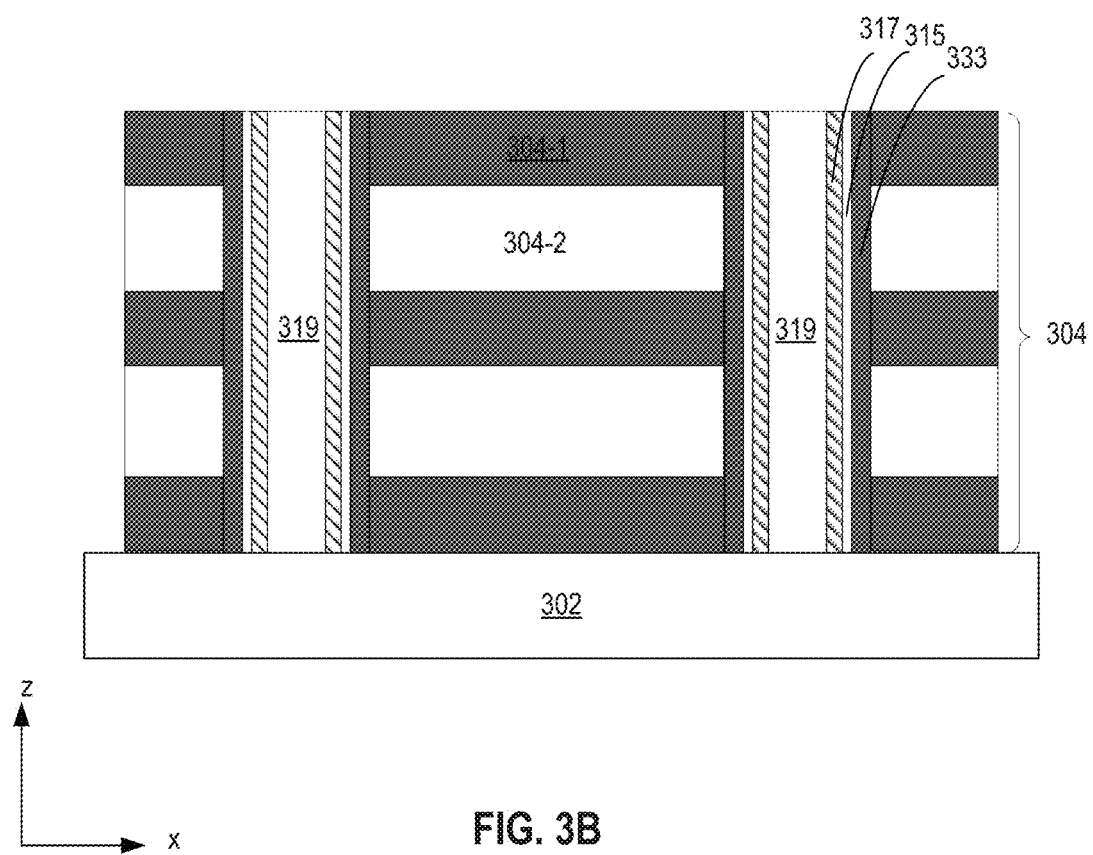
Figure 3C:
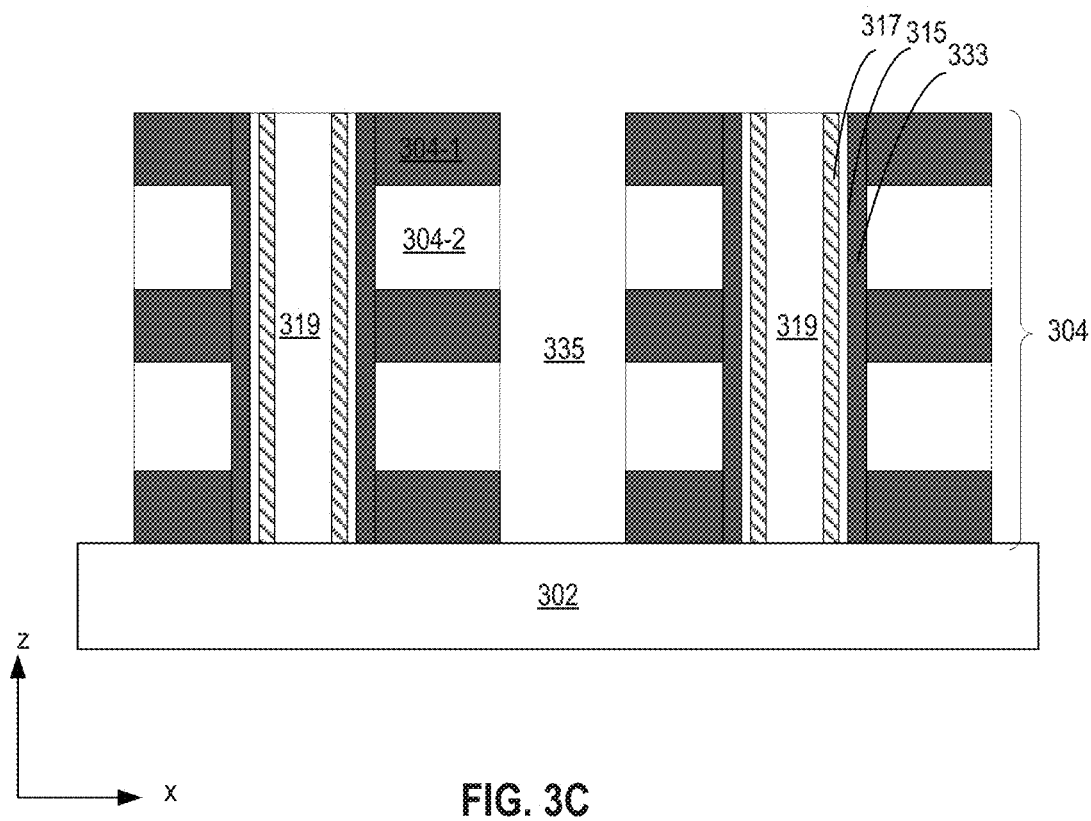
Figure 3D:
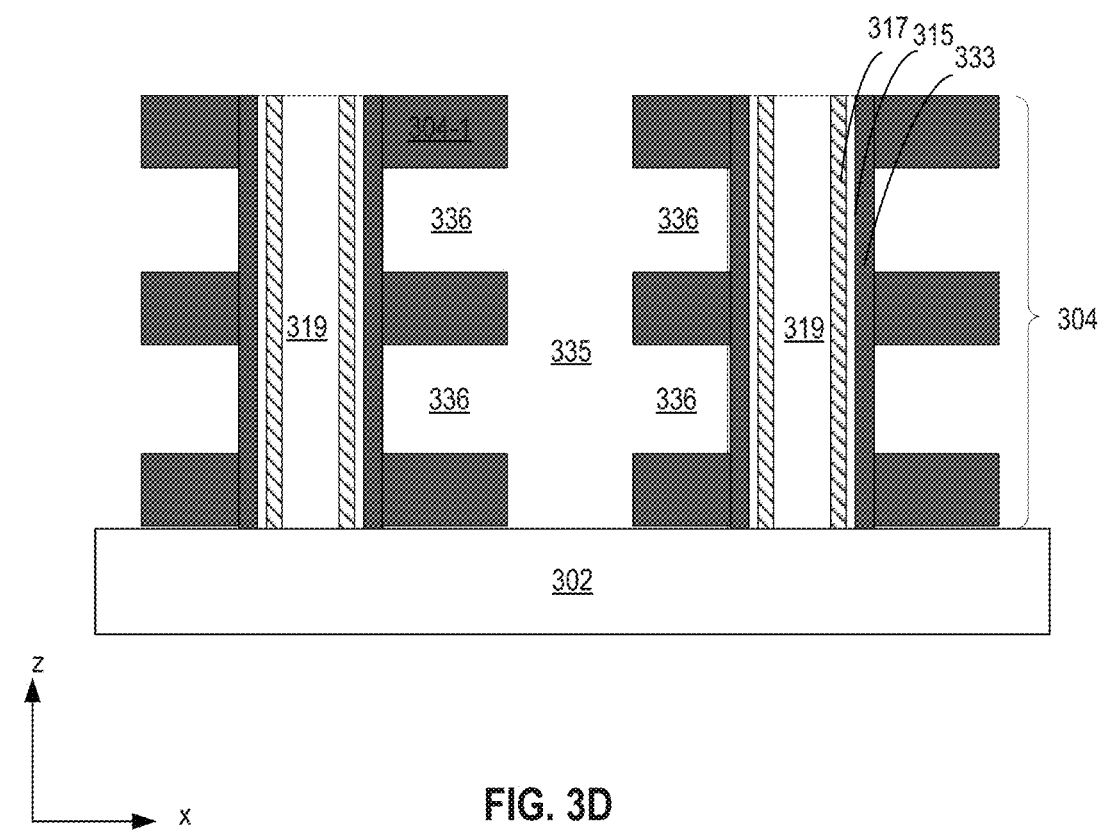

FIGS. 2A and 2B illustrate exemplary 3D memory devices 200 and 201, according to some embodiments. In some embodiments, 3D memory devices 200 and 201 may each include a substrate 202, a plurality of gate structures extending in parallel above substrate 202, a plurality of channel structures 230 extending vertically (e.g., along the z axis or vertical direction) through memory stack 204 into substrate 202, and a source structure 206 extending vertically through memory stack 204. A gate structure may include a conductor layer 210 partially surrounded by a gate dielectric layer 222. 3D memory devices 200 and 201 may each include a sealing structure 208 that insulates adjacent gate structures along the vertical direction. In some embodiments, as shown in FIG. 2A, sealing structure 208 includes an air gap 215 between adjacent gate structures (or conductor layers 210). In some embodiments, as shown in FIG. 2B, 3D memory device 201 may include no air gap between adjacent gate structures. The details of each structure are described as follows.

Substrate 202 can include silicon (e.g., single crystalline silicon), silicon germanium (SiGe), gallium arsenide (GaAs), germanium (Ge), silicon on insulator (SOI), and/or any other suitable materials. In some embodiments, substrate 202 includes silicon.

Memory stack 204 may include a plurality of conductor layers 210 extending laterally (e.g., along the x-y plane and in parallel with substrate 202). The intersection of channel structures 230 and conductor layers 210 may form a plurality of memory cells. The number of the conductor layers in memory stack 204 (e.g., 32, 64, 96, or 128) determines the number of memory cells in 3D memory device 201. Conductor layers 210 can include conductor materials including, but not limited to, tungsten (W), cobalt (Co), copper (Cu), aluminum (Al), polycrystalline silicon (polysilicon), doped silicon, silicides, or any combination thereof.

Conductor layers 210 may each be partially surrounded by a gate dielectric layer 222. In some embodiments, gate dielectric layer 222 is between conductor layer 210 and adjacent channel structure 230. In some embodiments, gate dielectric layer 222 may surround at least a lateral surface, e.g., top and/or bottom surfaces, of conductor layer 210. In some embodiments, gate dielectric layer 222 covers the top and bottom surfaces of conductor layer 210 and the side surface of conductor layer 210 that is facing channel structure 230. Gate dielectric layer 222 may include any suitable high-k dielectric material such as aluminum oxide (AlO), hafnium oxide (HfO$_2$), and tantalum pentoxide (Ta$_2$O$_5$). In some embodiments, gate dielectric layer 222 includes AlO. Optionally, an adhesive layer 224 may be between gate dielectric layer 222 and conductor layer 210. Adhesive layer 224 may be over at least the side surface of conductor layer 210 that is facing channel structure 230. In some embodiments, adhesive layer 224 covers the top and bottom surfaces of conductor layer 210 and the side surface of conductor layer 210 that is facing channel structure 230. In some embodiments, conductor layer 210 and the respective gate dielectric layer 222 (and the respective adhesive layer 224, if any), may be referred to as a gate structure.

Memory stack 204 also includes a sealing structure 208 that insulates adjacent gate structures (or adjacent conductor layers 210) along the vertical direction (e.g., the z axis). Gate structures may be located in sealing structure 208. Sealing structure 208 may form a plurality of dielectric layers each between a pair of gate structures (or conductor layers 210). Conductor layers 210 and the dielectric layers may form an alternating conductor/dielectric stack alternate in the vertical direction (e.g., the z axis). In other words, except for the ones at the top or bottom of the alternating conductor/dielectric stack, each conductor layer 210 can be adjoined by two dielectric layers on both sides, and each dielectric layer can be adjoined by two conductor layers 210 on both sides. Conductor layers 210 can each have the same thickness or have different thicknesses. Similarly, the dielectric layers can each have the same thickness or have different thicknesses. Sealing structure 208 (or the dielectric layers) can include dielectric materials including, but not limited to, silicon oxide, silicon nitride, silicon oxynitride, or any combination thereof. In some embodiments, conductor layers 210 include metal layers, such as W, and sealing structure 208 (or the dielectric layer) includes SiO.

In some embodiments, as shown in FIG. 2A, sealing structure 208 may include an air gap 215 between one or more pairs of adjacent gate structures. Airgap 215 may provide further insulation between gate structures and reduce gate-to-gate coupling capacitance, facilitate z-pitch scaling. The dimensions of airgap 215 may vary as design and/or fabrication vary. For example, a distance between the top/bottom surface of airgap 215 and adjacent blocking layer may vary in different embodiments. The specific dimensions of airgap 215 should not be limited by the embodiments of the present disclosure. In some embodiments, as shown in FIG. 2B, a dielectric layer (or sealing structure 208) may fill up space between adjacent gate structures and sealing structure 208 includes no air gap between gate structures.

Channel structures 230 may form an array and may each extend vertically above substrate 202. Channel structure 230 can include a semiconductor channel extending vertically through the alternating conductor/dielectric stack. The semiconductor channel can include a blocking layer 220, a memory layer 212, a tunneling layer 214, a semiconductor layer 216, and a dielectric core 218, arranged inwardly and radially towards the center of channel structure 230. In some embodiments, dielectric core 218 may be surrounded and covered by semiconductor layer 216. Dielectric core 218 may have a pillar shape extending along the vertical direction (e.g., the z axis).

Blocking layer 220 can reduce or prevent charges from escaping into conductor layers 210. Blocking layer 220 may include a plurality of blocking portions 220a disconnected from one another. Each blocking portion 220a may include a vertical blocking portion 220-1 between a respective conductor layer 210/gate structure and the respective memory layer 212. Vertical blocking portion 220-1 may also be referred to herein as being under the respective conductor layer 210/gate structure. Each blocking portion 220a may also include at least one lateral blocking portion 220-2 covering a respective lateral surface of the respective conductor layer 210/gate structure. In some embodiments, blocking portion 220a may include a pair of lateral blocking portions 220-2 covering the top and bottom surfaces of the respective conductor layer 210/gate structure. The pair of lateral blocking portions 220-2 may be in contact with vertical blocking portions 220-1. In some embodiments, blocking portion 220a may cover the respective gate dielectric layer 222 (and adhesive layer 224 if any).

Blocking layer 220 can include a single-layered structure or a multiple-layered structure. A thickness of blocking layer 220 may be in a range of about 40 Å to about 100 Å. In some embodiments, the thickness is in a range of about 50 Å to about 70 Å. For example, blocking layer can include a dielectric metal oxide having a sufficiently high dielectric constant (e.g., greater than 7.9.) Examples of blocking layer 220 include AlO, hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, silicon oxide, silicon oxynitride, and/or silicon nitride. In some embodiments, blocking layer 220 includes silicon oxynitride (i.e., SiON).

Memory layer 212 can include a charge-trapping material and can be formed between blocking layer 220 and tunneling layer 214. Memory layer 212 may include a plurality of memory portions 212a each between the respective vertical blocking portions 220-1 and tunneling layer 214. In some embodiments, memory portion 212a may be covered by the respective vertical blocking portion 220-1. The disconnection between adjacent memory portions 212a may reduce or prevent trapped charges from spreading vertically, which causes cell to cell interference. Z-pitch scaling may be further improved. Memory layer 212 can include a single-layered structure or a multiple-layered structure. For example, memory layer 212 can include conductive materials and/or semiconductors such as tungsten, molybdenum, tantalum, titanium, platinum, ruthenium, alloys thereof, nanoparticles thereof, silicides thereof, and/or polycrystalline or amorphous semiconductor materials (e.g., polysilicon and amorphous silicon.) Memory layer 212 can also include one or more insulating materials such as SiN and/or SiON. In some embodiments, memory layer 212 includes SiN.

Tunneling layer 214 can include a dielectric material through which tunneling can occur under a suitable bias. Tunneling layer 214 can be formed between memory layer 212 (or respective memory portion 212a) and semiconductor layer 216. Tunneling layer 214 may extend continuously along the vertical direction and can include a single-layered structure or a multiple-layered structure. For example, tunneling layer 214 can include SiO, SiN, SiON, dielectric metal oxides, dielectric metal oxynitride, dielectric metal silicates, and/or alloys thereof. In some embodiments, tunneling layer 214 includes SiO. Sealing structure 208 may be in contact with tunneling layer 214. In some embodiments, sealing structure 208 may be in contact with memory layer 212 and blocking layer 220. In other words, sealing structure 208 may surround and cover blocking layer 220, memory layer 212, and tunneling layer 214.

Semiconductor layer 216, extending continuously along the vertical direction, can include a semiconductor channel that facilitates the transport of charges and can be formed over tunneling layer 214. Semiconductor layer 216 can include one or more semiconductor materials such as a one-element semiconductor material, an III-V compound semiconductor material, an II-VI compound semiconductor material, and/or an organic semiconductor material. In some embodiments, semiconductor layer 216 includes a polysilicon layer.

Dielectric core 218, extending continuously along the vertical direction, can include a suitable dielectric material and can fill up space surrounded by semiconductor layer 216. In some embodiments, dielectric core 218 includes SiO (e.g., SiO of sufficiently high purity).

In some embodiments, channel structure 230 further includes a conductive plug (e.g., a semiconductor plug, not shown in the figures) in the lower portion (e.g., at the lower end of bottom) of channel structure 230. As used herein, the "upper end" of a component (e.g., channel structure 230) is the end farther away from substrate 202 in the vertical direction, and the "lower end" of the component (e.g., channel structure 230) is the end closer to substrate 202 in the vertical direction when substrate 202 is positioned in the lowest plane of 3D memory device 200/201. The conductive plug can include a semiconductor material, such as silicon, which is epitaxially grown from substrate 202 or deposited onto substrate 202 in any suitable directions. It is understood that in some embodiments, the conductive plug includes single crystalline silicon, the same material as substrate 202. In other words, the conductive plug can include an epitaxially-grown semiconductor layer grown from substrate 202. The conductive plug can also include a different material than substrate 202. In some embodiments, the conductive plug includes at least one of silicon, germanium, and silicon germanium. In some embodiments, part of the conductive plug is above the top surface of substrate 202 and in contact with the semiconductor channel. The conductive plug may be conductively connected to the semiconductor channel.

In some embodiments, channel structure 230 further includes a drain structure (e.g., channel plug) in the upper portion (e.g., at the upper end) of channel structure 230. The drain structure can be in contact with the upper end of the semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or Ta/TaN as an adhesion layer and tungsten as a conductor material.

Source structure 206 may extend vertically through sealing structure 208 and the gate structures and is in contact with substrate 202. Source structure 206 may include an insulating spacer 251 and a source contact 226 in insulating spacer 251. Insulating spacer 251 may provide insulation between source contact 226 and surrounding conductor layers 210. In some embodiments, source structure 206 may further include a doped region 228 in substrate 202 and in contact with source contact 226. Source contact 226 may be conductively connected to doped region 228 so that a source voltage can be applied on memory cells through doped region 228 and source contact 226. In some embodiments, the insulating spacer may include a suitable dielectric material such as SiO. In some embodiments, source contact 226 may include a suitable conductive material such one or more of tungsten, polysilicon, doped silicon, silicides, aluminum, copper, and cobalt. Doped region 228 may include suitable dopants with opposite polarity versus substrate 202.

Figure 3E:
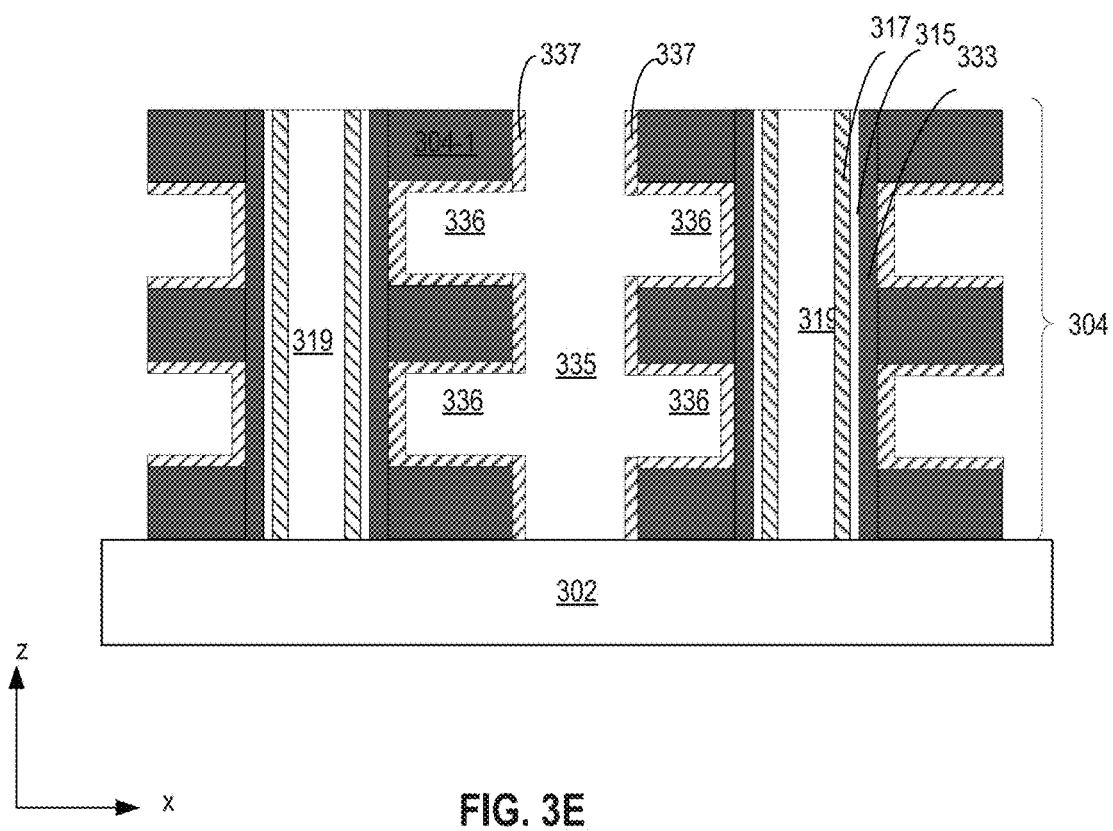
Figure 3F:
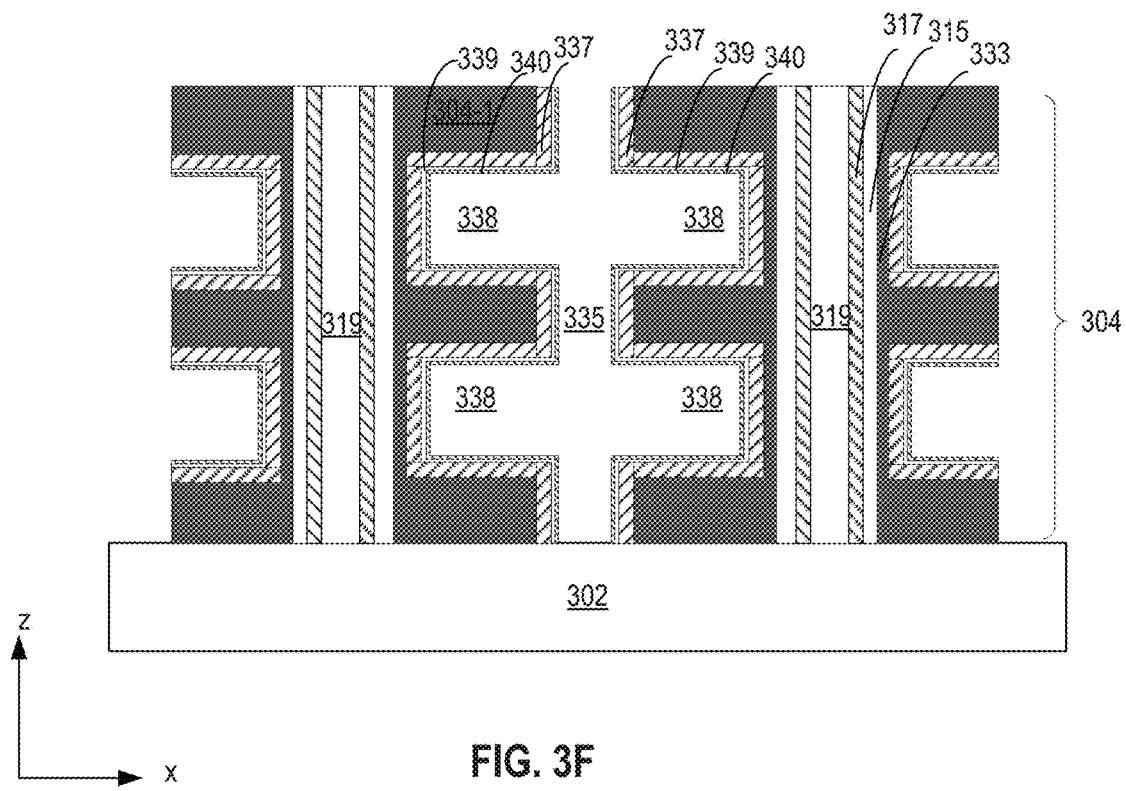
Figure 3G:
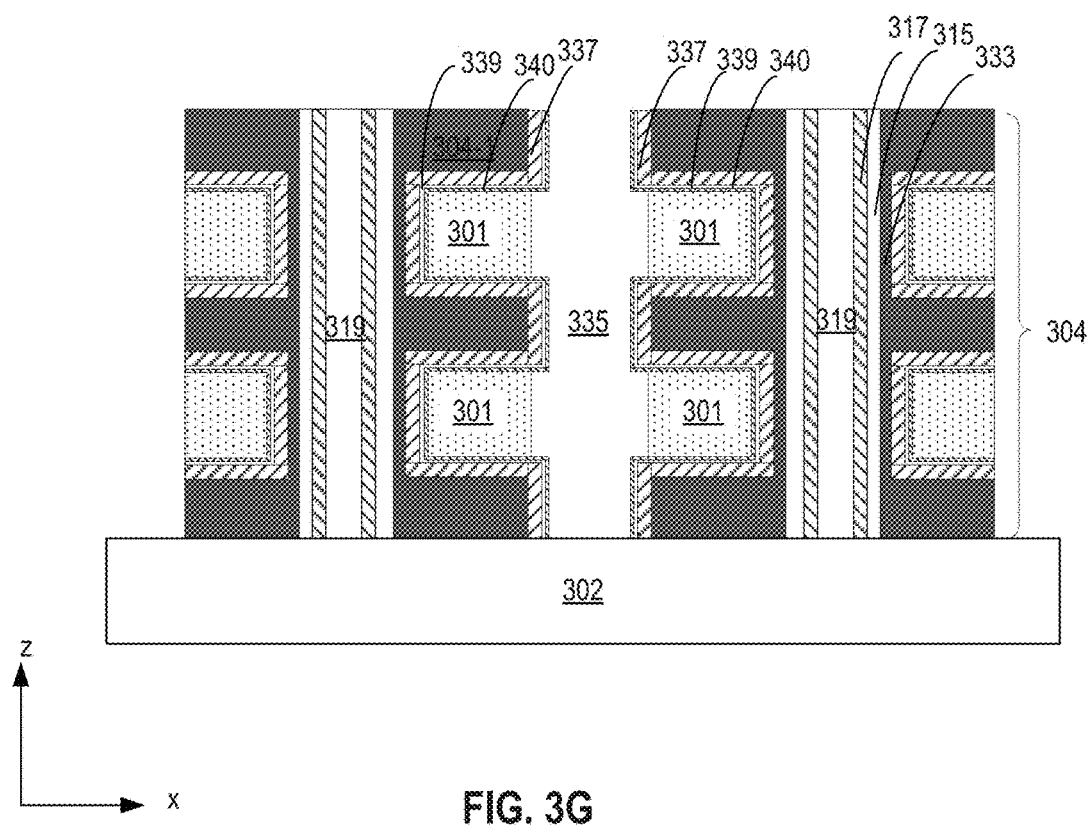
Figure 3H:
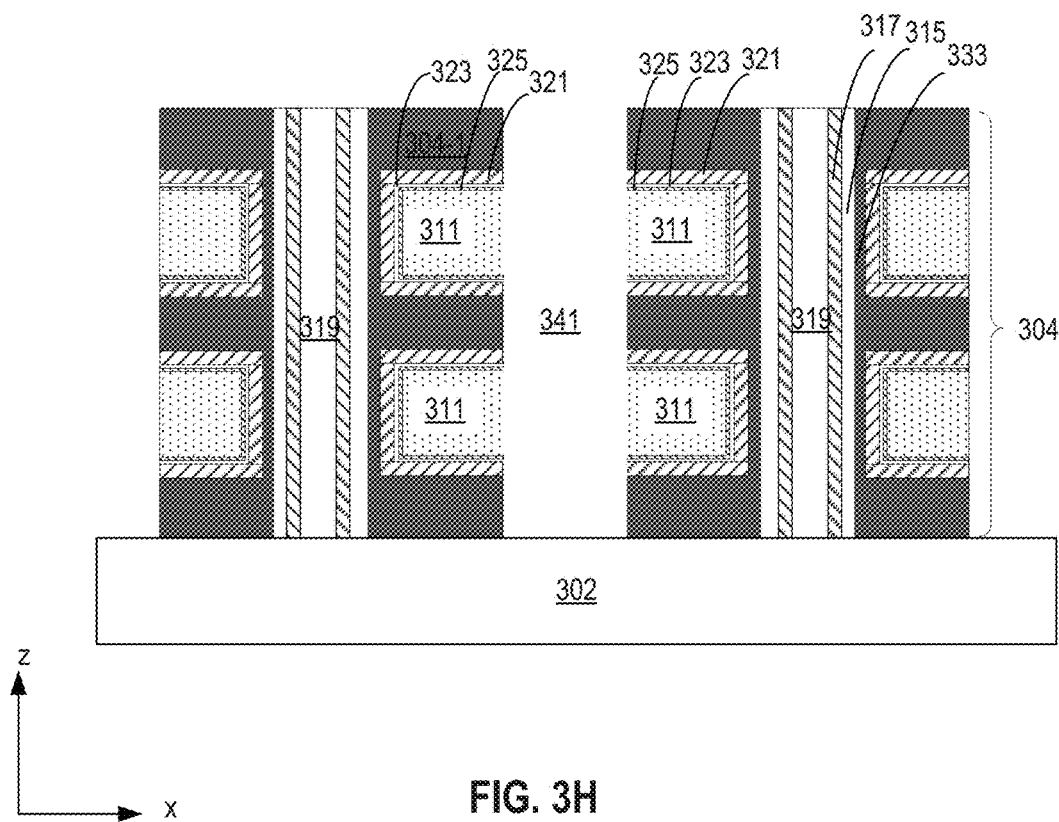
Figure 3I:
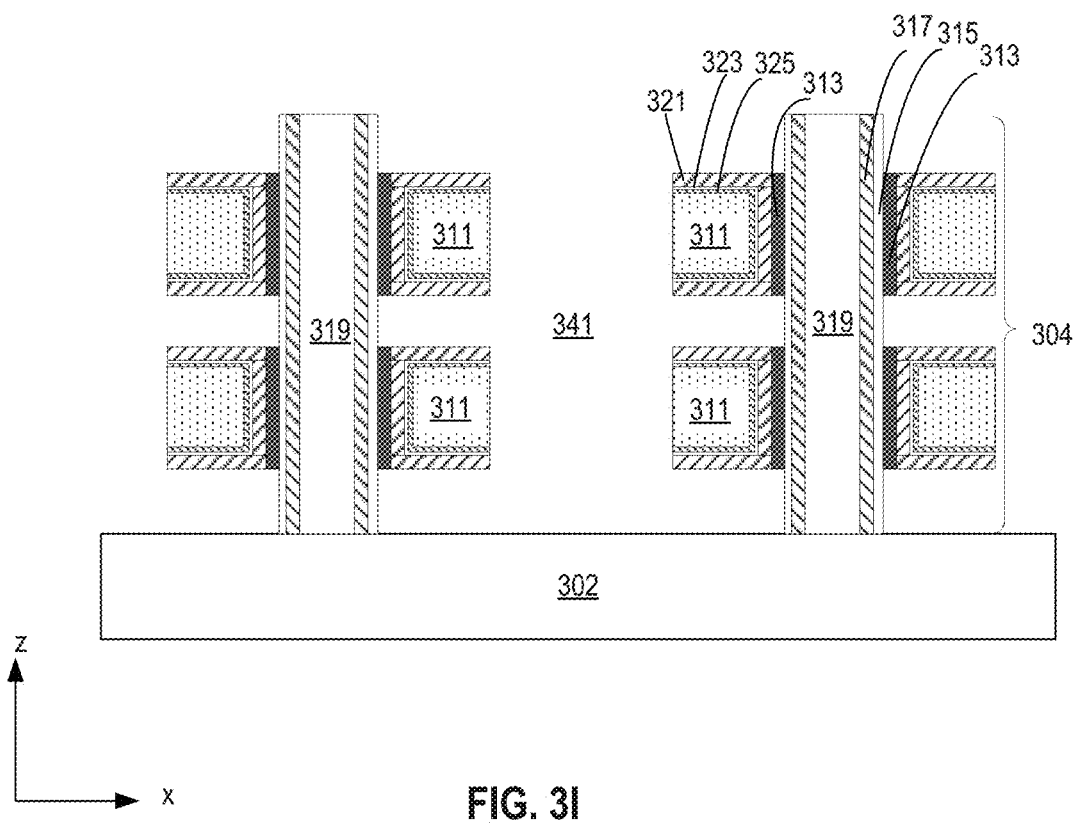
Figure 3J:
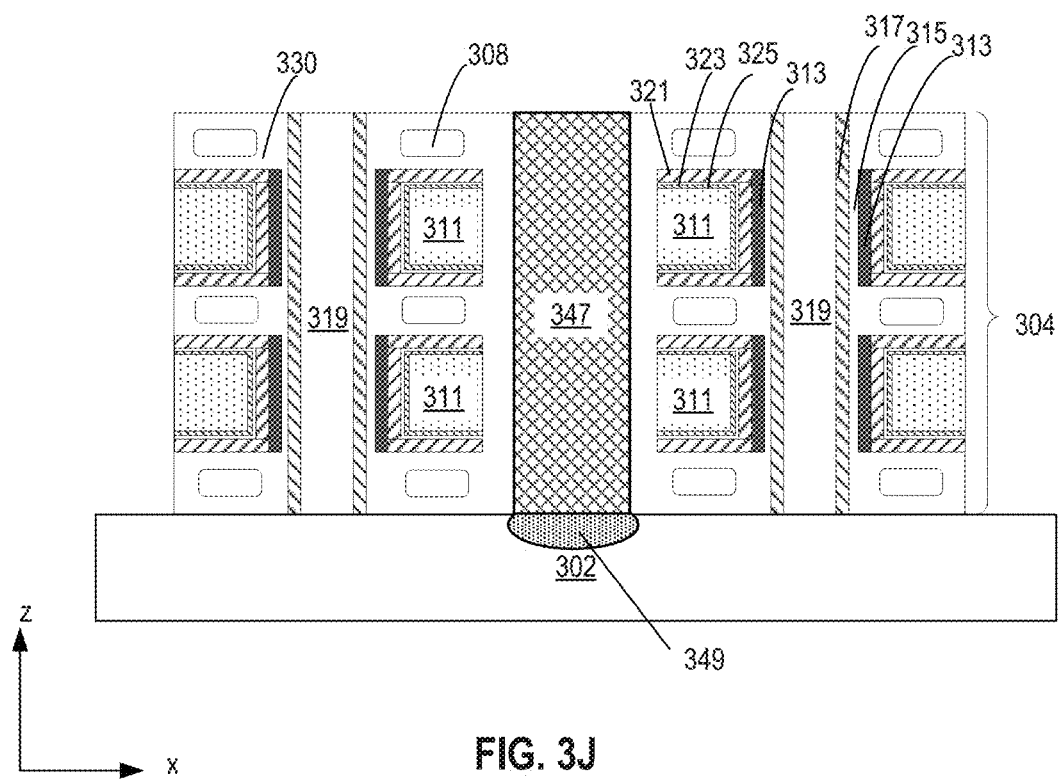
Figure 3K:
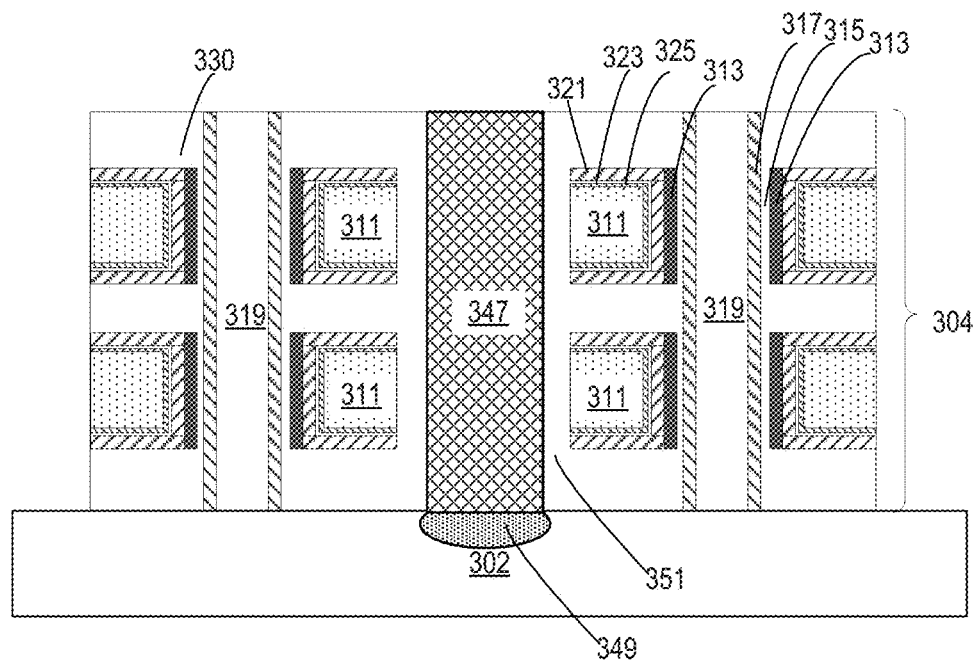
Figure 4A:
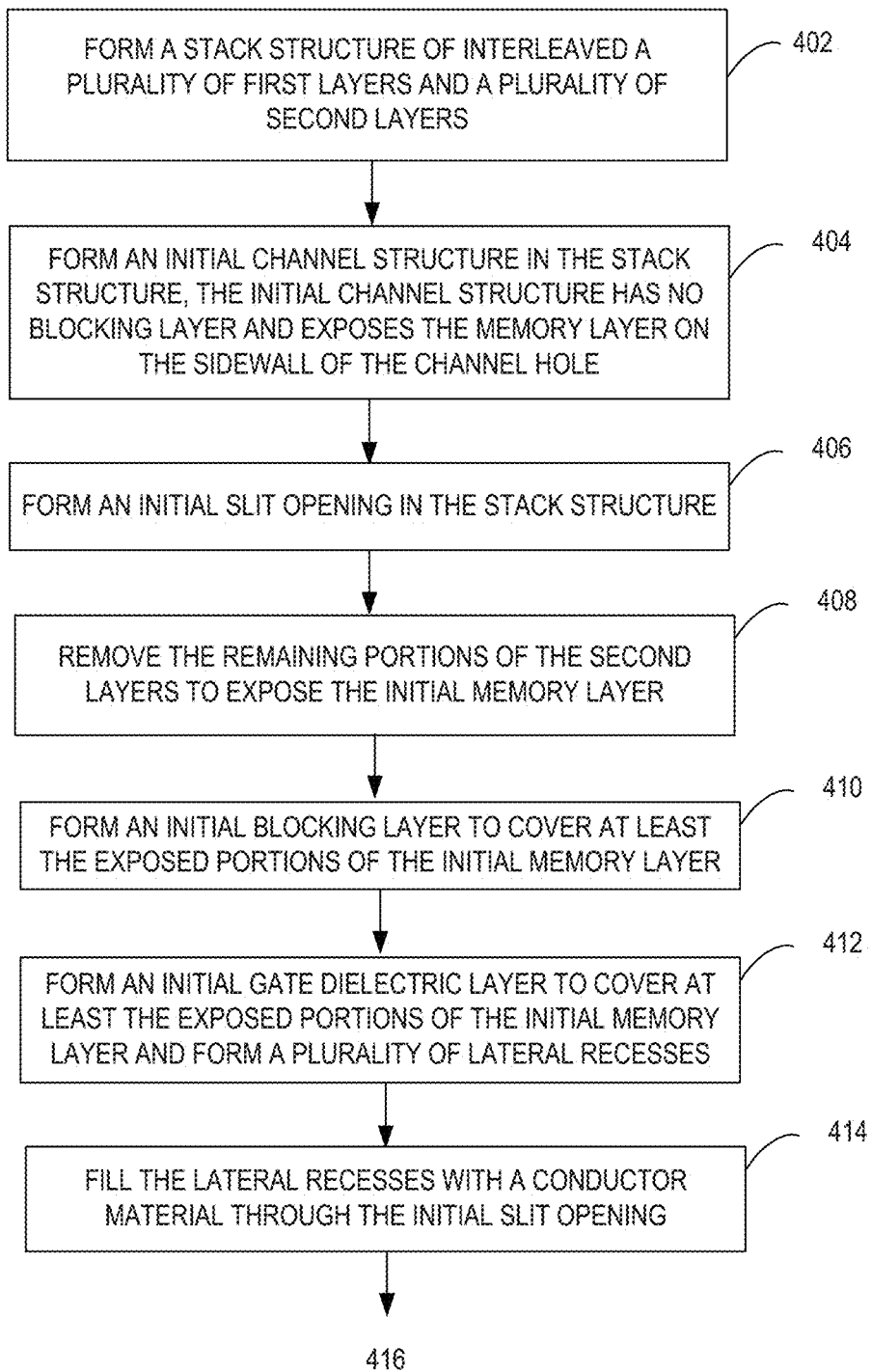
FIGS. 4A and 4B illustrate a flowchart of an exemplary method for forming a 3D memory device, according to some embodiments of the present disclosure.
Figure 4B:
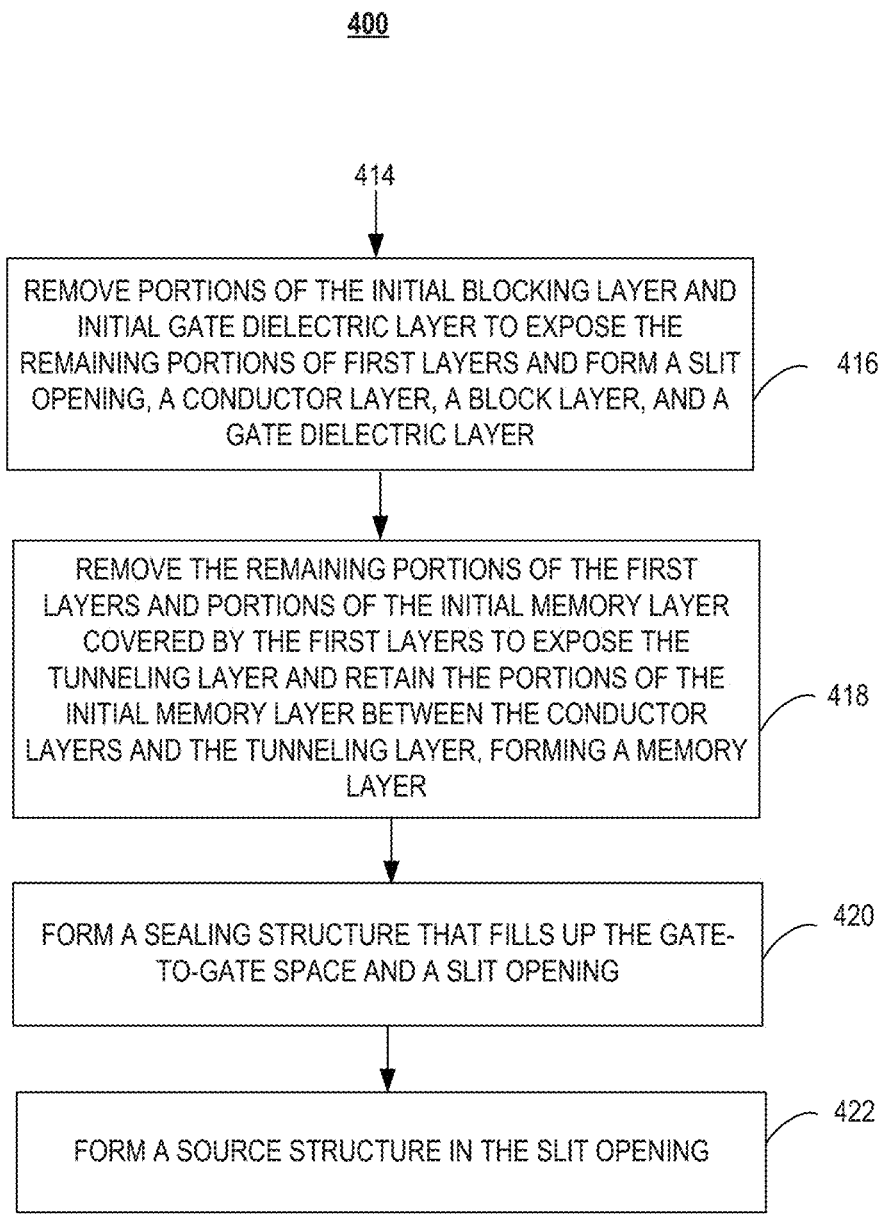

FIGS. 3A-3K illustrate an exemplary fabrication process to form 3D memory devices 200 and 201, according to embodiments of the present disclosure. FIGS. 4A and 4B illustrate a flowchart of exemplary fabrication method 400 to form 3D memory devices 200 and 201 illustrated in FIGS. 3A-3K. FIG. 4B is a continuation of FIG. 4A. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4A, at the beginning of the fabrication process, a stack structure of interleaved a plurality of first layers and a plurality of second layers is formed over a substrate (Operation 402). FIG. 3A illustrates a corresponding structure.

As shown in FIG. 3A, a stack structure 304 of a plurality of first layers 304-1 and a plurality of second layers 304-2, interleaved with one another, may be formed over a substrate 302. First layers 304-1 and second layers 304-2 may be arranged as a plurality of first layer 304-1/second layer 304-2 pairs stacked vertically over substrate 302. The number of first layer 304-1/second layer 304-2 pairs in stack structure 304 (e.g., 32, 64, 96, or 128) can set the number of memory cells in the 3D memory device. First layers 304-1 and second layers 304-2 may include different sacrificial materials and can be subsequently removed and replaced by other structures/materials. In some embodiments, first layers 304-1 and second layers 304-2 include different dielectric materials.

First layers 304-1 can each have the same thickness or have different thicknesses. Similarly, second layers 304-2 can each have the same thickness or have different thicknesses. In some embodiments, a thickness d1 of first layer 304-1 is less than a thickness d2 of second layer 304-2. The total thickness of d1 and d2 may be less than the total thickness of a conductor/dielectric pair in a related art, facilitating the z-pitch scaling. Thickness d1 may be in a range of about 150 Å to about 250 Å, and thickness d2 may be in a range of about 300 Å to about 400 Å. In some embodiments, thickness d1 is about 200 Å and thickness d2 is about 350 Å. Second layers 304-2 can include a suitable material that is different from the material of first layers 304-1. In some embodiments, first layers 304-1 includes silicon nitride, which can be employed in the subsequent formation of the blocking layer. In some embodiments, second layers 304-2 includes SiO.

First layers 304-1 and second layers 304-2 can be formed by repetitively and alternatingly depositing layers of a first sacrificial material (e.g., for forming first layers 304-1) and layers of a second sacrificial material (e.g., for forming second layers 304-2) over substrate 302. The deposition can include any suitable deposition methods such as atomic layered deposition (ALD), chemical vapor deposition (CVD), and/or physical vapor deposition (PVD). In some embodiments, stack structure 304 includes a staircase structure. The formation of the stack structure may include repetitive etching of first layers 304-1 and second layers 304-2 using an etch mask (e.g., a patterned photoresist or PR layer) over stack structure 304. The etch mask can be trimmed to expose the portions of first layers 304-1 and second layers 304-2 to be etched so that the exposed portions can be etched using a suitable etching process. First and second layers 304-1 and 304-2 may be etched incrementally and inwardly from the boundary of the layers, often from all directions. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each first layer 304-1/second layer 304-2 pair can be etched to form the staircase structure in stack structure 304. The etching of first and second layers 304-1 and 304-2 may include a wet etching process. The PR layer can then be removed. The staircase structure may be formed at any suitable stage of the fabrication process of 3D memory devices 200/201, before the formation of the conductor layers.

Referring back to FIG. 4A, after the formation of the stack structure, an initial channel structure is formed in the stack structure, the initial channel structure having no blocking layer and exposing the memory layer on the sidewall of the channel hole (Operation 404). FIG. 3B illustrates a corresponding structure.

As shown in FIG. 3B, an initial channel structure may be formed in stack structure 304, extending vertically through first and second layers 304-1 and 304-2. The initial channel structure may include an initial memory layer 333, a tunneling layer 315, a semiconductor layer 317, and a dielectric core 319 arranged inwardly from a sidewall of a channel hole towards the center of the channel hole. The initial channel structure may not include materials for forming a blocking layer.

The channel hole can first be formed in stack structure 304. In some embodiments, the channel hole extends from a top surface of stack structure 304 to substrate 302. In some embodiments, a bottom portion of the channel hole exposes substrate 302. The channel hole can be formed by any suitable fabrication process. In some embodiments, a suitable etching process is performed to remove a portion of stack structure 304 until substrate 302 is exposed. The etching process can include an anisotropic etching process such as a dry etch and/or an isotropic etching process such as wet etch.

After the channel hole is formed, as shown in FIG. 3B, the initial channel structure can be formed by sequentially depositing initial memory layer 333, tunneling layer 315, semiconductor layer 317, and dielectric core 319 to fill up the channel hole. In some embodiments, initial memory layer 333, tunneling layer 315, semiconductor layer 317, and dielectric core 319 may be positioned sequentially from the sidewall of the channel hole towards the center of the channel hole. In some embodiments, initial memory layer 333 may be deposited over the sidewall of the channel hole, and dielectric core 319 may fill up the space surrounded by semiconductor layer 317. In some embodiments, a lateral thickness of initial memory layer 333 (e.g., the thickness of initial memory layer 333 along the x axis) may be greater than the thickness of a memory layer in an existing 3D memory device in the related art. Initial memory layer 333 may provide the material base for the formation of a blocking layer and a memory layer. In some embodiments, initial memory layer 333 includes SiN, tunneling layer 315 includes SiO, semiconductor layer 317 includes polysilicon, and dielectric core 319 includes SiO, and can each be formed by one or more of CVD, ALD, and PVD, and metal organic chemical vapor deposition (MOCVD).

Referring back to FIG. 4A, after the formation of the initial channel structure, an initial slit opening is formed in the stack structure (Operation 406). FIG. 3C illustrates a corresponding structure.

As shown in FIG. 3C, an initial slit opening 335 may be formed in stack structure 304, exposing substrate 302. In some embodiments, initial slit opening 335 may be formed between adjacent initial channel structures. Initial slit opening 335 may be formed by patterning stack structure 304 by removing a portion of first layers 304-1 and second layers 304-2. The etching of stack structure 304 may include an anisotropic etching process such as dry etch and/or an isotropic etching process such as wet etch.

Referring back to FIG. 4A, after the formation of the initial slit opening, remaining portions of the second layers may be removed to expose the initial memory layer (Operation 408). FIG. 3D illustrates a corresponding structure.

As shown in FIG. 3D, the remaining portions of second layers 304-2 may be removed to expose initial memory layer 333. In some embodiments, the remaining portions of first layers 304-1 may also be exposed. For example, the top and bottom surfaces of the remaining portion of first layer 304-1 and a side surface of first layer 304-1 facing initial slit opening 335. An initial lateral recess 336 may be formed by the space between adjacent remaining first layers 304-1. Initial lateral recess 336 may be in contact with initial slit opening 335. In some embodiments, initial lateral recess 336 may be partially surrounded by the exposed portion of initial memory layer 333 the top and bottom surfaces of adjacent remaining portions of first layers 304-1. The removal of second layers 304-2 may include performing a suitable isotropic etching process such as wet etch through initial slit opening 335. The etchant may selectively etch second layers 304-2 (e.g., SiO) over first layers 304-1 (e.g., SiN) and initial memory layer 333 (e.g., SiN) so little or no damage is caused on first layers 304-1 and initial memory layer 333.

Referring back to FIG. 4A, after the formation of the initial recesses, an initial blocking layer is formed to cover at least the exposed portions of the initial memory layer (Operation 410). FIG. 3E illustrates a corresponding structure.

As shown in FIG. 3E, an initial blocking layer 337 may be formed to cover at least the exposed portions of initial memory layer 333. In some embodiments, initial blocking layer 337 covers the sidewall of initial lateral recess 336. In some embodiments, initial blocking layer 337 covers the remaining portions of first layers 304-1 and the exposed portions of initial memory layer 333.

Initial blocking layer 337 may be formed by one or more of thermal oxidation and in-situ steam generation (ISSG). In some embodiments, other suitable deposition methods, such as CVD, ALD, and/or PVD, may also be employed to form initial blocking layer 337. In some embodiments, initial blocking layer 337 may be formed by partially oxidizing initial memory layer 333 and/or growing a layer of blocking material over initial memory layer 333. For example, a portion of initial memory layer 333 may first be oxidized/converted to the blocking material. If the blocking material formed from initial memory layer 333 does not reach a desired thickness, another layer of blocking layer may be formed by a separate deposition process (e.g., CVD, ALD, and/or PVD) until the total thickness of the blocking material reaches a desired value. In some embodiments, initial blocking layer 337 is formed only by depositing a layer of blocking material over initial memory layer 333. The blocking material, formed from initial memory layer 333 and/or deposition, may form initial blocking layer 337. In some embodiments, initial blocking layer 337 includes SiON, formed from the oxidation of initial memory layer 333 (e.g., SiN) and/or a separate deposition of SiON.

Referring back to FIG. 4A, after the formation of the initial blocking layer, an initial gate dielectric layer is formed to cover at least the exposed portions of the initial memory layer, forming a plurality of lateral recesses (Operation 412). FIG. 3F illustrates a corresponding structure.

As shown in FIG. 3F, an initial gate dielectric layer 339 may be formed to cover at least the portion of initial blocking layer 337 between adjacent first layers 304-1. In some embodiments, initial gate dielectric layer 339 may cover the entire initial blocking layer 337. Optionally, an initial adhesive layer 340 may be formed over initial gate dielectric layer 339. In some embodiments, initial gate dielectric layer 339 may include AlO and any initial adhesive layer 340 may include TiN. The remaining space of initial lateral recesses 336, after the formation of initial gate dielectric layer 339 and any initial adhesive layer 340, may form a plurality of lateral recesses 338. The formation of initial gate dielectric layer 339 and any initial adhesive layer 340 may include one or more of CVD, ALD, and PVD.

Referring back to FIG. 4A, after the formation of the initial gate dielectric layer and the lateral recesses, a conductor material is deposited to fill up the lateral recesses through the initial slit opening (Operation 414). FIG. 3G illustrates a corresponding structure.

As shown in FIG. 3G, a conductor material may be deposited through initial slit opening 335 to fill up lateral recesses 338, forming a plurality of initial conductor layers 301 over initial gate dielectric layer 339. In some embodiments, initial conductor layer 301 may be in contact with initial gate dielectric layer 339 (or any initial adhesive layer 340) in each lateral recess 338. In some embodiments, initial conductor layers 301 includes tungsten and can be formed by CVD, ALD, and/or PVD.

Referring back to FIG. 4B, after the formation of the initial conductor layers 301, portions of the initial blocking layer and initial gate dielectric layer are removed to expose the remaining portions of first layers, forming a slit opening, a conductor layer, a blocking layer, and a gate-dielectric layer (Operation 416). FIG. 3H illustrates a corresponding structure.

As shown in FIG. 3H, portions of initial blocking layer 337 and portions of initial gate dielectric layer 339 (and portions of initial adhesive layer 340, if any) may be removed to expose the remaining portions of first layers 304-1. A suitable selective etching process may be performed to remove the portions of initial blocking layer 337 and the portions of initial gate dielectric layer 339 (and the portions of initial adhesive layer 340, if any). The etchant may have a higher etching rate on initial blocking layer 337, initial gate dielectric layer 339, and any initial adhesive layer 340 over initial conductor layers 301 and first layers 304-1. The etching may result in a slit opening 341, a conductor layers 311, a blocking layer 321, a gate dielectric layer 323, and an adhesive layer 325 (if any). In some embodiments, slit opening 341 exposes substrate 302 at the bottom and exposes conductor layer 311 and the remaining portions of first layers 304-1 on the sidewall. In some embodiments, along the sidewall of slit opening 341, conductor layer 311, blocking layer 321, gate dielectric layer 323, and adhesive layer 325 (if any) may be coplanar. Stack structure 304 may then be referred to as a memory stack.

The etching process may disconnect initial blocking layer 337, initial gate dielectric layer 339, initial adhesive layer 340 (if any) between adjacent initial conductor layers 301. The etching process may also remove any excess material of conductor material on the sidewall of slit opening 341, forming a conductor layer 311. In some embodiments, a sidewall of slit opening exposes neighboring conductor layers 311. Blocking layer 321, having a plurality of disconnected blocking portions, may be formed. In some embodiments, each blocking portion includes a pair of lateral blocking portions that cover the top and bottom surfaces of the respective conductor layer 311 and a vertical blocking portion between the respective conductor layer 311 and initial memory layer 333. In some embodiments, gate dielectric layer 323 and adhesive layer 325 may have similar shapes as blocking layer 321. For example, each of gate dielectric layer 323 and adhesive layer 325 (if any) may cover the top and bottom surfaces of the respective conductor layer 311 and the side surface of conductor layer 311 facing initial memory layer 333. In some embodiments, a suitable "etch-back" process, which includes an isotropic etching process such as wet etch is performed. In some embodiments, first layers 304-1 include SiN, initial blocking layer 337 includes SiON, initial conductor layers 301 include tungsten, and the etchant includes hydrofluoride (HF) acid.

Referring back to FIG. 4B, after the formation of slit opening and blocking layer, the remaining portions of first layers and the portions of initial memory layers covered by the first layers are removed to expose the tunneling layer, and the portions of the initial memory layer between the conductor layers and the tunneling layer are retained, forming a memory layer (Operation 418). FIG. 3I illustrates a corresponding structure.

As shown in FIG. 3I, the remaining portions of first layers 304-1 and the portions of initial memory layers 333 covered by first layers 304-1 are removed to expose tunneling layer 315, and the portions of the initial memory layer 333 between conductor layers 311 and the tunneling layer 315 are retained. A memory layer 313 having a plurality of memory portions may be formed. Each memory portion may be between a respective conductor layer 311 and tunneling layer 315, and may be disconnected from one another along the z axis. A channel structure, having blocking layer 321, memory layer 313, tunneling layer 315, semiconductor layer 317, and dielectric core 319, may be formed. In some embodiments, the vertical blocking portion of blocking layer 321 may cover the respective memory portion along the z axis. Top and bottom surfaces of each blocking portion, and the portion of tunneling layer 315 between adjacent block portions may be exposed. A gate-to-gate space between adjacent blocking layers 321 (or adjacent gate structures) may be formed. In some embodiments, slit opening 341 is in contact with the gate-to-gate space.

A suitable isotropic etching process such as wet etch may be performed to remove first layers 304-1 and portions of initial memory layers 333. The etchant may have a higher etching rate on first layers 304-1 and initial memory layer 333 over tunneling layer 315 and blocking layer 321, so the etching may stop on tunneling layer 315 and blocking layer 321 after first layers 304-1 and portions of initial memory layer 333 are removed. In some embodiments, the etching time may be controlled so memory portions between conductor layers 311 and tunneling layer 315 may be retained. The etching time may allow memory portions to have desired length along the z axis. In some embodiments, first layers 304-1 and initial memory layer 333 include SiN, blocking layer 321 includes SiON, and the etchant includes phosphoric acid.

Referring back to FIG. 4B, after the formation of the memory layer, a sealing structure is formed to fill up the gate-to-gate space, and a slit opening is formed (Operation 420). FIGS. 3J and 3K illustrate corresponding structures.

As shown in FIGS. 3J and 3K, a sealing structure 330 may be formed to surround each gate structure so gate structures are insulated from one another. Each gate structure, partially enclosed by a respective blocking portion, may be in sealing structure 330. The portion of sealing structure 330 surrounding each gate structure can be sufficiently thick to ensure the respective gate structure is insulated from other structures (e.g., other gate structures). In some embodiments, as shown in FIG. 3J, sealing structure 330 includes an airgap 308 formed between adjacent gate structures (or adjacent blocking portions) to provide further insulation between adjacent gate structures. In some embodiments, air gap 308 may be embedded in sealing structure 330 and between adjacent structures. In some embodiments, sealing structure 330 covers the blocking layer 321 (e.g., blocking portions), exposed portions of memory layer 313 (e.g., memory portions) and exposed portions of tunneling layer 315.

In some embodiments, as shown in FIG. 3K, sealing structure 330 may not include an air gap between adjacent gate structures. That is, space between adjacent gate structures (or blocking portions) can be filled with the insulating material that forms sealing structure 330. The formation of airgaps in sealing structure 330 may be controlled by adjusting the parameters in the deposition process that forms sealing structure. For example, a deposition to sputter ratio (e.g., DS ratio) in the deposition process can be controlled to form airgaps of desired quantity and sizes. Sealing structure 330 may be formed using any suitable deposition methods. In some embodiments, sealing structure 330 is formed by a rapid thermal CVD and the sealing structure 330 includes silicon oxide. In various applications, the rapid thermal CVD can also be referred to herein as a "rapid sealing" process. Optionally, a planarization/recess etch process can be performed or remove excessive portions of sealing structure 330 over stack structure 304.

Referring back to FIG. 4B, after the formation of sealing structure, a source structure is formed in the slit opening (Operation 422). FIGS. 3J and 3K illustrate corresponding structures.

As shown in FIGS. 3J and 3K, a source structure may be formed in slit opening 341. The source structure may include a source contact 347 and an insulating spacer 351 in which source contact 347 is located. In some embodiments, the source structure includes a doped region 349 in substrate 302. In some embodiments, sealing structure 330 may cover a sidewall of slit opening 341, forming an insulating spacer 351 that covers neighboring conductor layers 311. Insulating spacer 351 may have sufficient thickness over conductor layers 311 and provide insulation between source contact 347 and conductor layers 311. In some embodiments, source contact 347 is in contact with doped region 349.

In some embodiments, insulating spacer 351 may be formed as a part of sealing structure 330. Insulating spacer 351 may cover the sidewall of slit opening 341 so a sufficient thickness of insulating material, e.g., the material that forms sealing structure 330, may be formed over conductor layers 311. Optionally, a recess etch (e.g., dry etch and/or wet etch) may be performed to remove any excess materials of sealing structure 330 so a desired thickness of insulating spacer 351 is formed in slit opening 341. In some embodiments, substrate 302 may be exposed at the bottom of slit opening 341 after the recess etch. The etch can also be referred to herein as a "bottom punch through" process. A suitable doping process, e.g., ion implantation, may be performed to form doped region 349 in substrate 302.

In some embodiments, substrate 302 includes silicon and doped region 349 includes doped silicon. Source contact 347 can then be formed by filling the remaining space in slit opening 341, surrounded by insulating spacer 351, with a suitable conductive material such as tungsten. The deposition may include CVD, ALD, PVD, etc. Optionally, a planarization/recess etch process can be performed to remove excessive portions of the conductive material over stack structure 304.

The present disclosure provides a 3D memory device. In some embodiments, the 3D memory device includes a plurality of conductor layers extending over a substrate, a channel structure vertically extending through the conductor layers to the substrate, and a source structure extending through the conductor layers to the substrate. The channel structure may include a blocking layer having a plurality of blocking portions disconnected from one another. Each of the blocking portions may include (i) a vertical blocking portion under a respective conductor layer, and (ii) at least one lateral blocking portion covering a respective lateral surface of the respective conductor layer. The channel structure may also include a memory layer having a plurality of memory portions disconnected from one another, each of the memory portions under and in contact with the respective vertical blocking portion.

In some embodiments, the blocking layer includes silicon oxynitride, and the memory layer includes silicon nitride.

In some embodiments, the 3D memory device further includes a sealing structure in which the conductor layers, the channel structure, and the source structure are located. The sealing layer may be in contact with a tunneling layer of the channel structure and may enclose the conductor layers, the blocking layer, and the memory layer.

In some embodiments, the sealing structure includes an air gap between adjacent lateral blocking portions.

In some embodiments, the sealing structure includes silicon oxide.

In some embodiments, the 3D memory device further includes a high-k dielectric layer between each of the blocking portions and the respective conductor layer. The high-k dielectric layer may include (i) a vertical high-k portion between the respective conductor layer and the respective vertical blocking portion, and (ii) at least one lateral high-k portion covering between the respective conductor layer and the respective lateral blocking portion.

The present disclosure also includes a method for forming a 3D memory device. The method may include the following operations. First, an initial channel structure may be formed in a stack structure that has interleaved a plurality of first layers and a plurality of second layers over a substrate, the initial channel structure being without a blocking layer. An initial slit opening may be formed in the stack structure. Remaining portions of the second layers may be removed to form a plurality of gate structures each surrounded by a blocking portion of a blocking layer. Remaining portions of the first layers and portions of the initial channel structure may be removed to form a sealing structure in contact with each of the gate structures and exposed portions of the initial channel structure. Further, a source structure may be formed in the sealing structure between adjacent gate structures.

In some embodiments, forming the stack structure includes forming the plurality of first layers and the plurality of second layers of different dielectric materials.

In some embodiments, forming the initial channel structure includes forming a channel hole vertically extending through the stack structure into the substrate, and depositing, sequentially, an initial memory layer, a tunneling layer, a semiconductor layer, and a dielectric core inwardly from a sidewall to a center of the channel hole.

In some embodiments, removing the portions of the initial channel structure includes removing portions of the initial memory layer to expose the tunneling layer.

In some embodiments, a formation of the plurality of gate structures each surrounded by a blocking portion of the blocking layer includes the following operations. First, after removing the remaining portions of the second layers, an initial blocking layer may be deposited to cover the remaining portions of the first layers and exposed portions of the initial memory layer. An initial high-k dielectric layer may be deposited over the initial blocking layer. A conductor material may then be deposited to fill in lateral recesses surrounded by the initial high-k dielectric layer and the initial blocking layer to form a plurality of conductor layers.

Portions of the initial high-k dielectric layer and the initial blocking layer between adjacent conductor layers may be removed to form the high-k dielectric layer surrounding the respective conductor layer in each gate structure and the blocking portion surrounding the respective gate structure.

In some embodiments, forming the initial blocking layer comprises performing at least one of thermal oxidation or in-situ steam generation (ISSG) to partially convert the initial memory layer into the initial blocking layer.

In some embodiments, forming the sealing structure includes forming a dielectric material to be in contact with the tunneling layer and enclosing the memory layer, the blocking layer, and the conductor layers. The dielectric material may insulate the plurality of gate structures from one another.

In some embodiments, forming the sealing structure includes forming an air gap between adjacent conductor layers.

In some embodiments, forming the source structure includes forming a slit opening in the sealing structure, forming an insulating spacer from the sealing structure in the slit opening, forming a doped region in the substrate at a bottom of the slit opening, and depositing a conductive material to fill in the slit opening.

The present disclosure also provides another method for forming a 3D memory device. In some embodiments, the method includes the following operations. First, an initial channel structure is formed in a stack structure that includes interleaved a plurality of first layers and a plurality of second layers over a substrate. An initial slit opening may be formed in the stack structure and remaining portions of the second layers may be removed to expose an initial memory layer of the initial channel structure. An initial blocking layer may be formed to cover remaining portions of the first layers and the exposed portions of the initial memory layer. A plurality of conductor layers may then be formed in a plurality of lateral recesses surrounded by the initial blocking layer. Portions of the initial memory layer may be removed to form a memory layer having a plurality of memory portions disconnected from one another and portions of the initial blocking layer to form a plurality of blocking portions disconnected from one another. Further, a source structure may be formed between adjacent conductor layers.

In some embodiments, forming the stack structure includes forming the plurality of first layers and the plurality of second layers of different dielectric materials.

In some embodiments, forming the initial channel structure includes forming a channel hole vertically extending through the stack structure into the substrate, and depositing, sequentially, the initial memory layer, a tunneling layer, a semiconductor layer, and a dielectric core inwardly from a sidewall to a center of the channel hole.

In some embodiments, the method further includes, after removing the portions of the initial blocking layer and the initial memory layer, removing the remaining portions of the first layers to expose the tunneling layer.

In some embodiments, removing the remaining portions of the first layers comprises controlling an etching time of the remaining portions of the first layers to retain the memory layers.

In some embodiments, removing the remaining portions of the second layers includes performing isotropic etching process to selectively etch the remaining portions of the second layers over the remaining portions of the first layers.

In some embodiments, forming the initial blocking layer includes performing at least one of thermal oxidation or in-situ steam generation (ISSG) to partially convert the initial memory layer into the initial blocking layer.

In some embodiments, the method further includes depositing an initial high-k dielectric layer over the initial blocking layer before a formation of the conductor layers.

In some embodiments, the method further includes forming an adhesive layer between the initial high-k dielectric layer and the conductor layers.

In some embodiments, the method further includes depositing the conductor layers over the initial high-k dielectric layer.

In some embodiments, the method further includes forming a sealing structure in contact with the tunneling layer and enclosing the memory layer, the blocking layer, and the conductor layers. The sealing layer may insulate the plurality of conductor layers from one another.

In some embodiments, forming the sealing structure includes forming an air gap between adjacent conductor layers.

In some embodiments, forming the source structure includes forming a slit opening in the sealing structure, forming an insulating spacer from the sealing structure in the slit opening, forming a doped region in the substrate at a bottom of the slit opening, and depositing a conductive material to fill in the slit opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming an initial channel structure in a stack structure that comprises interleaved a plurality of first layers and a plurality of second layers over a substrate, the initial channel structure including an initial memory layer and being without a blocking layer;
   forming an initial slit opening in the stack structure;

removing remaining portions of the second layers to expose portions of the initial memory layer and to form a plurality of gate structures each surrounded by a blocking portion of a blocking layer;

forming an initial blocking layer to cover remaining portions of the first layers and the exposed portions of the initial memory layer, the initial blocking layer comprising the blocking portion of the blocking layer; and after forming the initial blocking layer, removing the remaining portions of the first layers and portions of the initial channel structure, comprising removing portions of the initial memory layer covered by the remaining portions of the first layers, to form a sealing structure in contact with each of the gate structures and exposed portions of the initial channel structure.

2. The method of claim 1, wherein forming the stack structure comprises forming the plurality of first layers and the plurality of second layers of different dielectric materials.

3. The method of claim 1, wherein forming the initial channel structure comprises:

forming a channel hole vertically extending through the stack structure into the substrate; and depositing, sequentially, the initial memory layer, a tunneling layer, a semiconductor layer, and a dielectric core inwardly from a sidewall to a center of the channel hole.

4. The method of claim 3, wherein removing the portions of the initial channel structure comprises removing the portions of the initial memory layer to expose the tunneling layer.

5. The method of claim 3, wherein: removing the portions of the initial channel structure comprises removing the portions of the initial memory layer that were in contact with the plurality of first layers to expose the tunneling layer.

6. The method of claim 3, further comprising forming the sealing structure in a recess that exposes the tunneling layer.

7. The method of claim 1, wherein a formation of the plurality of gate structures each surrounded by the blocking portion of the blocking layer comprises:

depositing, after removing the remaining portions of the second layers, the initial blocking layer to cover the remaining portions of the first layers and the exposed portions of the initial memory layer;

depositing an initial high-k dielectric layer over the initial blocking layer;

depositing a conductor material to fill in lateral recesses surrounded by the initial high-k dielectric layer and the initial blocking layer to form a plurality of conductor layers; and removing portions of the initial high-k dielectric layer and the initial blocking layer between adjacent conductor layers to form a high-k dielectric layer surrounding the respective conductor layer in each gate structure and the blocking portion surrounding the respective gate structure.

8. The method of claim 7, wherein forming the initial blocking layer comprises performing at least one of thermal oxidation or in-situ steam generation (ISSG) to partially convert the initial memory layer into the initial blocking layer.

9. The method of claim 7, wherein forming the sealing structure comprises forming a dielectric material to be in contact with a tunneling layer and enclosing a memory layer formed by other portions of the initial memory layer, the blocking layer, and the conductor layers, wherein the dielectric material insulates the plurality of gate structures from one another.

10. The method of claim 9, wherein forming the sealing structure comprises forming an air gap between adjacent conductor layers.

11. A method for forming a three-dimensional (3D) memory device, comprising:

forming an initial channel structure in a stack structure that comprises interleaved a plurality of first layers and a plurality of second layers over a substrate;

forming an initial slit opening in the stack structure;

removing remaining portions of the second layers to expose an initial memory layer of the initial channel structure, the exposed portions of the initial memory layer being without a blocking material;

forming an initial blocking layer to cover remaining portions of the first layers and the exposed portions of the initial memory layer;

forming a plurality of conductor layers in a plurality of lateral recesses surrounded by the initial blocking layer; and removing portions of the initial memory layer to form a memory layer having a plurality of memory portions disconnected from one another and portions of the initial blocking layer to form a plurality of blocking portions disconnected from one another.

12. The method of claim 11, wherein forming the stack structure comprises forming the plurality of first layers and the plurality of second layers of different dielectric materials.

13. The method of claim 12, wherein forming the initial channel structure comprises:

forming a channel hole vertically extending through the stack structure into the substrate; and depositing, sequentially, the initial memory layer, a tunneling layer, a semiconductor layer, and a dielectric core inwardly from a sidewall to a center of the channel hole.

14. The method of claim 13, further comprising removing the portions of the initial blocking layer, the remaining portions of the first layers, and the portions of the initial memory layer to expose the tunneling layer.

15. The method of claim 14, wherein removing the remaining portions of the first layers comprises controlling an etching time of the remaining portions of the first layers to retain the memory layer.

16. The method of claim 13, further comprising removing the remaining portions of the first layers and the portions of the initial memory layer that was in contact with the remaining portions of the first layers to expose the tunneling layer.

17. The method of claim 12, wherein:

removing the remaining portions of the second layers comprises performing isotropic etching process to selectively etch the remaining portions of the second layers over the remaining portions of the first layers; and forming the initial blocking layer comprises performing at least one of thermal oxidation or in-situ steam generation (ISSG) to partially convert the initial memory layer into the initial blocking layer.

18. The method of claim 11, further comprising forming a sealing structure that includes an air gap between adjacent conductor layers.

19. The method of claim 18, wherein forming the sealing structure comprises forming the sealing structure in a recess that exposes a tunneling layer.

20. The method of claim 11, wherein each of the blocking portions comprises:
- a vertical blocking portion between a respective conductor layer and the memory layer; and
- at least one lateral blocking portion covering a respective lateral surface of the respective conductor layer.

* * * * *